United States Patent
An et al.

(10) Patent No.: US 9,577,019 B2
(45) Date of Patent: Feb. 21, 2017

(54) ORGANIC LIGHT-EMITTING DIODE DISPLAY AND METHOD OF MANUFACTURING THE SAME

(71) Applicant: Samsung Display Co., Ltd., Yongin, Gyeonggi-Do (KR)

(72) Inventors: Jinsung An, Yongin (KR); Juwon Yoon, Yongin (KR); Jeongsoo Lee, Yongin (KR); Jiseon Lee, Yongin (KR); Choongyoul Im, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 44 days.

(21) Appl. No.: 14/644,049

(22) Filed: Mar. 10, 2015

(65) Prior Publication Data

US 2016/0111484 A1 Apr. 21, 2016

(30) Foreign Application Priority Data

Oct. 16, 2014 (KR) ......................... 10-2014-0140176

(51) Int. Cl.
| | | |
|---|---|---|
| *H01L 21/00* | (2006.01) | |
| *H01L 27/15* | (2006.01) | |
| *H01L 27/32* | (2006.01) | |
| *G09G 3/32* | (2016.01) | |

(52) U.S. Cl.
CPC ......... *H01L 27/3276* (2013.01); *G09G 3/3266* (2013.01); *G09G 2300/0426* (2013.01)

(58) Field of Classification Search
CPC .................................................... H01L 27/124
USPC ............................ 257/84, 99; 438/25–28, 66
See application file for complete search history.

(56) References Cited

U.S. PATENT DOCUMENTS

| | | | | |
|---|---|---|---|---|
| 8,232,935 | B2 * | 7/2012 | Mitomi | ................ G09G 3/3233 315/169.3 |
| 9,165,993 | B2 * | 10/2015 | Kim | .................... H01L 27/3265 257/532 |
| 2010/0295758 | A1 | 11/2010 | Kawabe | |
| 2011/0164019 | A1 | 7/2011 | Son | |
| 2014/0034923 | A1 | 2/2014 | Kim et al. | |
| 2014/0084293 | A1 | 3/2014 | Ahn et al. | |

FOREIGN PATENT DOCUMENTS

| | | |
|---|---|---|
| KR | 10-2008-0047948 A | 5/2008 |
| KR | 10-2011-0080905 A | 7/2011 |
| KR | 10-2014-0018623 A | 2/2014 |

* cited by examiner

*Primary Examiner* — Calvin Lee
(74) *Attorney, Agent, or Firm* — Knobbe Martens Olson & Bear LLP

(57) ABSTRACT

An OLED display and a method of manufacturing the same are disclosed. In one aspect, the display device includes a plurality of pixels, wherein each of the pixels includes a plurality of wires including a first wire extending in a first direction and a second wire extending in a second direction crossing the first direction, the second wire having top and bottom portions opposing each other. The pixels also include a plurality of switching TFTs electrically connected to the wires, a driving TFT configured to supply a driving current, a storage capacitor electrically connected to the wires and the driving TFT, and a connecting wire electrically connecting the driving TFT to a selected one of the switching TFTs, wherein the connecting wire has top and bottom portions opposing each other, and wherein at least the top portions of the connecting wire and the second wire are formed on different layers.

19 Claims, 12 Drawing Sheets

ORGANIC LIGHT-EMITTING DIODE DISPLAY AND METHOD OF MANUFACTURING THE SAME

RELATED APPLICATION

This application claims the benefit of Korean Patent Application No. 10-2014-0140176, filed on Oct. 16, 2014, in the Korean Intellectual Property Office, the disclosure of which is incorporated herein in its entirety by reference.

BACKGROUND

Field

The described technology generally relates to an organic light-emitting diode (OLED) display and a method of manufacturing the same.

Description of the Related Technology

OLED displays do not require a separate light source, and thus their thickness and weight are generally less than those of liquid crystal displays (LCDs). Also, OLED displays have other favorable characteristics, such as low power consumption, high luminance, and high response speed.

SUMMARY OF CERTAIN INVENTIVE ASPECTS

One inventive aspect is an OLED display and a method of manufacturing the same.

Another aspect is a display device comprising a plurality of pixels, wherein each of the plurality of pixels includes: a plurality of wires that include a first wire extending in a first direction and a second wire extending in a second direction; a plurality of switching thin-film transistors that are connected to the plurality of wires; a driving thin-film transistor that supplies a driving current to each of the plurality of pixels; a storage capacitor that is connected to the plurality of wires and the driving thin-film transistor; and a connecting wire that connects the driving thin-film transistor and any one of the plurality of switching thin-film transistors and is formed adjacent to the second wire, wherein the connecting wire is formed on a different layer from the second wire.

The first wire can include a scanning line transmitting a scanning signal, and the second wire can include a data line transmitting a data signal.

The connecting wire can be formed below the second wire.

The connecting wire can be formed above a driving gate electrode of the driving thin-film transistor.

The connecting wire can be formed on a same layer as a second electrode of the storage capacitor.

A first electrode of the storage capacitor can be connected to a driving gate electrode of the driving thin-film transistor, and the connecting wire can include one end connected to any one of the plurality of switching thin-film transistors via a contact hole, and another end contacting the first electrode of the storage capacitor through a contact hole.

A second electrode of the storage capacitor can overlap the first electrode of the storage capacitor and include a concave portion at a location corresponding to a region where the other end of the connecting wire and the first electrode of the storage capacitor overlap each other.

Each of the plurality of pixels can further include a pixel electrode that is formed on the connecting wire and at least partially overlaps the connecting wire.

The display apparatus can further include: a first insulating layer that covers the connecting wire; and a second insulating layer that is formed between the first insulating layer and the pixel electrode.

Any one of the plurality of switching thin-film transistors can be an initialization thin-film transistor that transmits an initialization voltage to a gate electrode of the driving thin-film transistor.

Another aspect is a method of manufacturing a display device, the method including: forming a connecting wire that connects any one of a plurality of switching thin-film transistors and a driving thin-film transistor comprised in the display apparatus; and forming a second wire that extends in a second direction, crosses a first wire extending in a first direction, is formed adjacent to the connecting wire, and transmits a signal to each of a plurality of pixels included in the display apparatus, wherein the connecting wire and the second wire are formed on different layers.

The storage capacitor can include a first electrode and a second electrode, and the forming of the connecting wire can include forming the connecting wire on a same layer as one of the first and second electrodes.

The connecting wire can be formed on the same layer as the second electrode of the storage capacitor, and the second electrode of the storage capacitor can include a concave portion formed at a location corresponding to a region where another end of the connecting wire and the first electrode of the storage capacitor overlap each other.

The connecting wire can be formed below the second wire.

The second wire can include a data line.

The method can further include forming a pixel electrode that is formed on the second wire and at least partially overlaps the connecting wire.

The method can further include: forming a first insulating layer that is formed between the connecting wire and the second wire; and forming a second insulating layer that is formed on the first insulating layer and below the pixel electrode.

Another aspect is a display device comprising a plurality of pixels, wherein each of the pixels comprises a plurality of wires comprising a first wire extending in a first direction and a second wire extending in a second direction crossing the first direction, wherein the second wire has top and bottom portions opposing each other. The pixels also comprise a plurality of switching thin-film transistors (TFTs) electrically connected to the wires, a driving TFT configured to supply a driving current, a storage capacitor electrically connected to the wires and the driving TFT, and a connecting wire electrically connecting the driving TFT to a selected one of the switching TFTs, wherein the connecting wire has top and bottom portions opposing each other, and wherein at least the top portions of the connecting wire and the second wire are formed on different layers.

In the above display device, the first wire comprises a scanning line configured to provide a scanning signal, wherein the second wire comprises a data line configured to provide a data signal.

In the above display device, the top portion of the connecting wire is formed below the top portion of the second wire.

In the above display device, the driving TFT comprises a driving gate electrode, and wherein the connecting wire is formed over the driving gate electrode.

In the above display device, the storage capacitor comprises first and second electrodes, wherein the top portion of the connecting wire is formed on the same layer as at least a portion of the second electrode.

In the above display device, the driving TFT comprises a driving gate electrode, wherein the first electrode of the storage capacitor is electrically connected to the driving gate electrode, and wherein the connecting wire has i) one lateral end electrically connected to the one of the switching TFTs via a first contact hole and ii) another lateral end electrically connected to the first electrode of the storage capacitor through a second contact hole.

In the above display device, the second electrode of the storage capacitor at least partially overlaps the first electrode of the storage capacitor and has a concave portion formed where the another lateral end of the connecting wire and the first electrode of the storage capacitor overlap each other.

In the above display device, each of the pixels further comprises a pixel electrode formed over the connecting wire and at least partially overlapping the connecting wire.

The above display device further comprises a first insulating layer at least partially covering the connecting wire and a second insulating layer formed between the first insulating layer and the pixel electrode.

In the above display device, the driving TFT includes a gate electrode, wherein the selected switching TFT includes an initialization TFT configured to supply an initialization voltage to the gate electrode.

In the above display device, the bottom portions of the connecting wire and the second wire are formed in the same layer.

Another aspect is a method of manufacturing a display device comprising a plurality of switching thin film transistors (TFTs), a driving TFT and a plurality of pixels, the method comprising forming a connecting wire configured to electrically connect a selected one of the switching TFTs to the driving TFT, wherein the connecting wire has top and bottom portions opposing each other. The method also comprises forming a first wire extending in a first direction and forming a second wire extending in a second direction crossing the first direction, wherein the second wire is formed adjacent to the connecting wire and configured to transmit a signal to each of the pixels, wherein the second wire has top and bottom portions opposing each other, and wherein at least the top portions of the connecting wire and the second wire are formed on different layers.

The above method further comprises forming a storage capacitor including a first electrode and a second electrode, and wherein the forming of the connecting wire comprises forming the top portion of the connecting wire on the same layer as at least a portion of one of the first and second electrodes.

In the above method, the second electrode of the storage capacitor has a concave portion formed where one lateral end of the connecting wire and the first electrode of the storage capacitor overlap each other.

In the above method, the top portion of the connecting wire is formed below the top portion of the second wire.

In the above method, the second wire comprises a data line.

The above method further comprises forming a pixel electrode formed over the second wire and at least partially overlapping the connecting wire.

The above method further comprises forming a first insulating layer between the connecting wire and the second wire and forming a second insulating layer over the first insulating layer and below the pixel electrode.

Another aspect is a display device comprising a scan driver configured to provide a scan signal through a scan line extending in a first direction. The display device also comprises a data driver configured to provide a data signal through a data line extending in a second direction crossing the first direction, wherein the data line has top and bottom portions opposing each other. The display device further comprises a pixel electrically connected to the scan line and the data line, wherein each pixel comprises a switching thin-film transistor (TFT) configured to receive the scan signal and the data signal so as to generate a driving signal. The pixel also comprises a driving TFT configured to receive the driving signal so as to generate a driving current. The pixel further comprises a connecting wire electrically connecting the driving TFT to the switching TFT, wherein the connecting wire has top and bottom portions opposing each other, and wherein top portions of the connecting wire and the data lines are formed on different layers.

In the above display device, the height of the data line is greater than that of the connecting wire.

DETAILED DESCRIPTION OF CERTAIN INVENTIVE EMBODIMENTS

Figure 1:
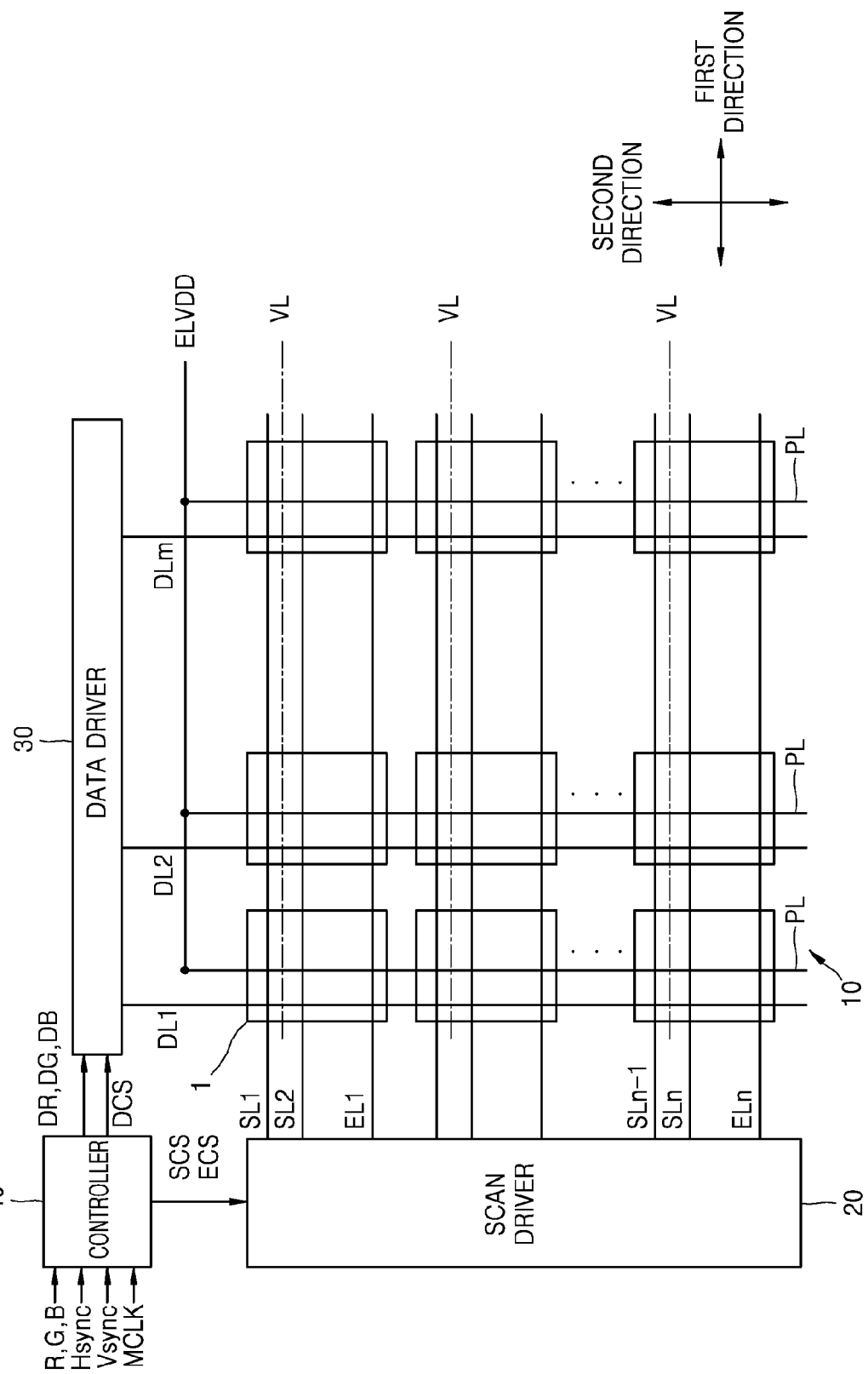
FIG. 1 is a block diagram schematically illustrating an OLED display according to an exemplary embodiment.

Reference will now be made in detail to exemplary embodiments, examples of which are illustrated in the accompanying drawings. In this regard, the present exemplary embodiments can have different forms and should not be construed as being limited to the descriptions set forth herein. Accordingly, the exemplary embodiments are merely described below, by referring to the figures, to explain aspects of the present description.

Those components that are the same or are in correspondence are rendered the same reference numeral regardless of the figure number, and redundant explanations are omitted.

As used herein, the term "and/or" includes any and all combinations of one or more of the associated listed items.

It will be understood that although the terms "first", "second", etc. can be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto.

When a certain embodiment can be implemented differently, a specific process order can be performed differently from the described order. For example, two consecutively described processes can be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a block diagram schematically illustrating an OLED display according to an exemplary embodiment.

The OLED display according to an exemplary embodiment includes a display unit 10 including a plurality of pixels 1, a scan driver 20, a data driver 30, and a controller 40.

The display unit 10 includes the pixels 1 that are arranged approximately in a matrix shape by being located at intersections of a plurality of first through nth scanning lines SL1 through SLn, a plurality of first through mth data lines DL1 through DLm, and a plurality of first through nth emission control lines EL1 through ELn. The first through nth scanning lines SL1 through SLn and the first through nth emission control lines EL1 through ELn extend in a first direction, e.g., a row direction. The first through mth data lines DL1 through DLm and a plurality of driving voltage lines PL extend in a second direction, e.g., a column direction. In one pixel line, a value of n in the first through nth scanning lines SL1 through SLn and a value of n in the first through nth emission control lines EL1 through ELn can be different from each other.

Each pixel 1 is connected to two of the first through nth scanning lines SL1 through SLn transmitted to the display unit 10. In FIG. 1, a scanning line corresponding to a current pixel line and a scanning line corresponding to a previous pixel line are connected to each pixel 1, but an embodiment is not limited thereto.

Each pixel 1 is connected to one of the first through mth data lines DL1 through DLm, and one of the first through nth emission control lines EL1 through ELn. Also, each pixel 1 is connected to one of a plurality of initialization voltage line VL that supply an initialization voltage, and one of the driving voltage lines PL that supply a first power voltage ELVDD. Although not illustrated, the two adjacent pixels 1 from among the pixels 1 can share one initialization voltage line VL, according to an exemplary embodiment.

The scan driver 20 generates and transmits two corresponding scanning signals to each pixel 1 through the first through nth scanning lines SL1 through SLn. For example, the scan driver 20 transmits a first scanning signal Sn through a scanning line corresponding to a row line of each pixel 1 and a second scanning signal Sn−1 through a scanning line corresponding to a previous row line of the row line. For example, the scan driver 20 transmits the first scanning signal Sn to the pixel 1 formed on the mth column line and the nth row line through the nth scanning line SLn, and the second scanning signal Sn−1 through the n−1th scanning line SLn−1. Also, the scan driver 20 can generate and transmit an emission control signal to each pixel 1 through the first through nth emission control lines EL1 through ELn.

In the current embodiment, a scanning signal and an emission control signal are generated by the same scan driver 20, but alternatively, the OLED display can further include an emission control driver (not shown), and an emission control signal can be generated by the emission control driver.

The data driver 30 transmits a data signal to each pixel 1 through the first through mth data lines DL1 through DLm.

The controller 40 changes a plurality of image signals R, G, and B received from an external source to a plurality of image data signals DR, DG, and DB, and transmits the image data signals DR, DG, and DB to the data driver 30. Also, the controller 40 generates a control signal for controlling driving of the scan driver 20 and the data driver 30 upon receiving a vertical synchronization signal Vsync, a horizontal synchronization signal Hsync, and a clock signal MCLK. The controller 40 transmits the control signal to each of the scan driver 20 and the data driver 30. For example, the controller 40 generates and transmits a scan driving control signal SCS and a emission driving control signal ECS to the scan driver 20 The controller 40 can also generate and transmit a data driving control signal DCS to the data driver 30.

Each pixel 1 receives the first power voltage ELVDD and a second power voltage ELVSS from an external source. The first power voltage ELVDD can be a certain high level voltage and the second power voltage ELVSS can be a ground voltage or a voltage less than the first power voltage ELVDD.

Figure 2:
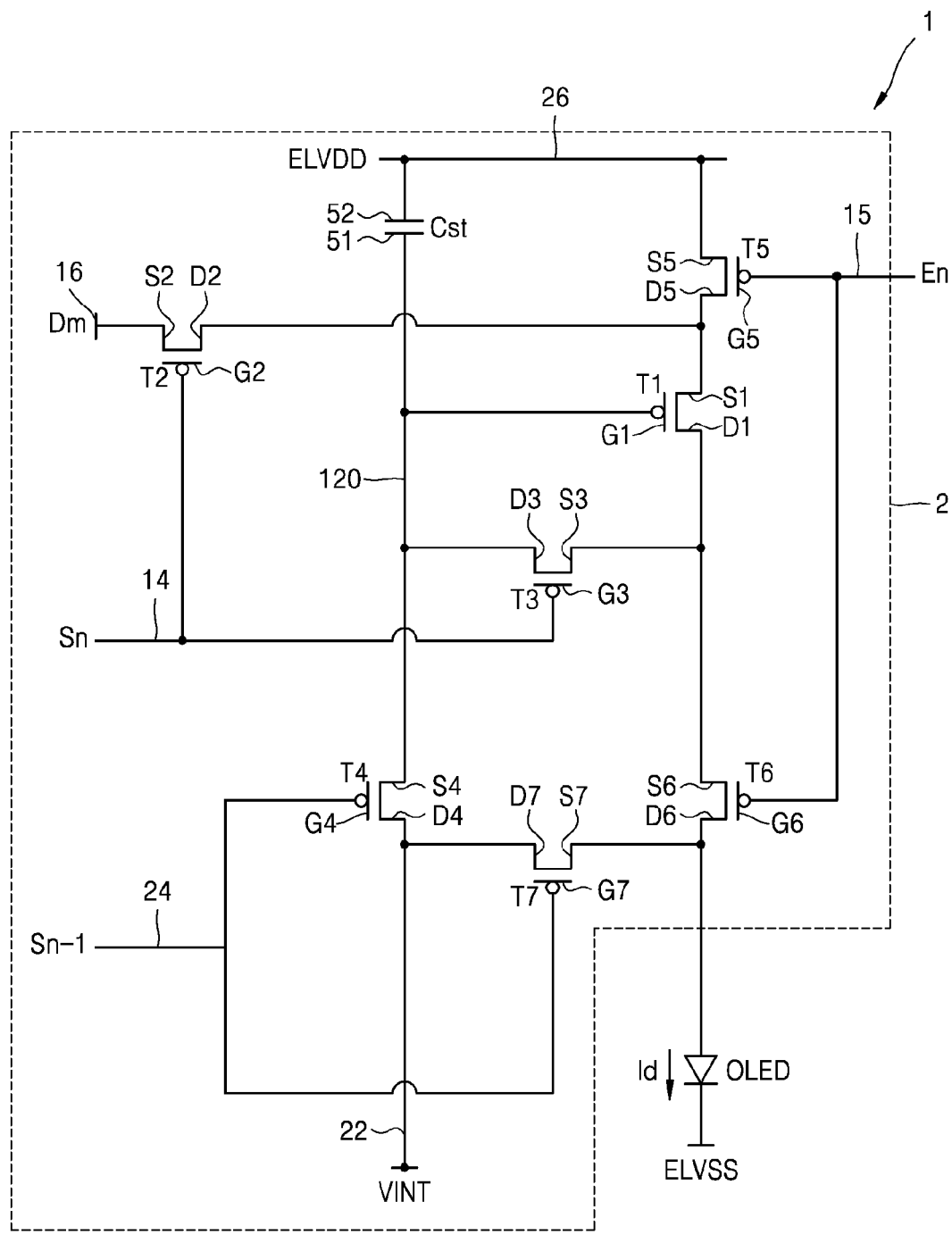
FIG. 2 is an equivalent circuit diagram of one pixel of an OLED display, according to an exemplary embodiment.

Each of the pixels 1 emits light having certain luminance by a driving current Id supplied to an OLED of FIG. 2 according to data signals received through the first through mth data lines DL1 through DLm.

FIG. 2 is an equivalent circuit diagram of one pixel 1 of an OLED display, according to an exemplary embodiment.

The pixel 1 includes a pixel circuit 2 that includes a plurality of thin-film transistors (TFTs) and a storage capacitor Cst. The pixel 1 can include the OLED that receives a driving voltage through the pixel circuit 2 to thereby emit light.

The TFTs include a driving TFT T1 and a plurality of switching TFTs. The switching TFTs include a data transmission TFT T2, a compensation TFT T3, a first initialization TFT T4, a first emission control TFT T5, a second emission control TFT T6, and a second initialization TFT T7.

The pixel 1 includes a first scanning line 14 through which the first scanning signal Sn is transmitted to the data transmission TFT T2 and the compensation TFT T3. The pixel 1 also includes a second scanning line 24 through which the second scanning signal Sn−1 is transmitted to the first initialization TFT T4 and the second initialization TFT T7. The pixel 1 also includes an emission control line 15 through which an emission control signal En is transmitted to the first emission control TFT T5 and the second emission control TFT T6 The pixel 1 further includes a data line 16 through which a data signal Dm is transmitted, a driving voltage line 26 through which the first power voltage ELVDD is transmitted, and an initialization voltage line 22 through which an initialization voltage VINT that initialize the driving TFT T1 is transmitted.

A driving gate electrode G1 of the driving TFT T1 is connected to a first electrode 51 of the storage capacitor Cst. A driving source electrode S1 of the driving TFT T1 is connected to the first emission control TFT T5 to be electrically connected to the driving voltage line 26. A driving drain electrode D1 of the driving TFT T1 is connected to the second emission control TFT T6 to be electrically connected to a pixel electrode (anode electrode) of the OLED. The driving TFT T1 receives the data signal Dm according to a switching operation of the data transmission TFT T2 to supply the driving current Id to the OLED.

A data transmission gate electrode G2 of the data transmission TFT T2 is connected to the first scanning line 14. A data transmission source electrode S2 of the data transmission TFT T2 is connected to the data line 16. A data transmission drain electrode D2 of the data transmission TFT T2 is connected to the driving source electrode S1 of the driving TFT T1 and is electrically connected to the first emission control TFT T5 to be connected to the driving voltage line 26. The data transmission TFT T2 is turned on according to the first scanning signal Sn received through the first scanning line 14 so as to perform a switching operation whereby the data signal Dm transmitted to the data line 16 is transmitted to the driving source electrode S1 of the driving TFT T1.

A compensation gate electrode G3 of the compensation TFT T3 is connected to the first scanning line 14. A compensation source electrode S3 of the compensation TFT T3 is connected to the driving drain electrode D1 of the driving TFT T1 and is electrically connected to the second emission control TFT T6 to be connected to the anode electrode of the OLED. A compensation drain electrode D3 of the compensation TFT T3 is also connected to the first electrode 51 of the storage capacitor Cst, a first initialization source electrode S4 of the first initialization TFT T4, and the driving gate electrode G1 of the driving TFT T1. The compensation TFT T3 is turned on according to the first scanning signal Sn to connect the driving gate electrode G1 to the driving drain electrode D1 of the driving TFT T1, thereby diode-connecting the driving TFT T1.

A first initialization gate electrode G4 of the first initialization TFT T4 is connected to the second scanning line 24. A first initialization drain electrode D4 of the first initialization TFT T4 is connected to the initialization voltage line 22. The first initialization source electrode S4 is also connected to the first electrode 51, the compensation drain electrode D3, and the driving gate electrode G1. The first initialization TFT T4 is turned on according to the second scanning signal Sn−1 to transmit an initialization voltage VINT to the driving gate electrode G1, thereby performing an initialization operation of initializing a voltage of the driving gate electrode G1.

A first emission control gate electrode G5 of the first emission control TFT T5 is connected to the emission control line 15. A first emission source electrode S5 of the first emission control TFT T5 is connected to the driving voltage line 26. A first emission control drain electrode D5 of the first emission control TFT T5 is connected to the driving source electrode S1 and the data transmission drain electrode D2.

A second emission control gate electrode G6 of the second emission control TFT T6 is connected to the emission control line 15. A second emission control source electrode S6 of the second emission control TFT T6 is connected to the driving drain electrode D1 and the compensation source electrode S3. A second emission control drain electrode D6 of the second emission control TFT T6 is electrically connected to the anode electrode of the OLED. The first emission control TFT T5 and the second emission control TFT T6 are substantially simultaneously turned on according to the emission control signal En received through the emission control line 15 so that the first power voltage ELVDD is transmitted to the OLED, and the driving current Id flows through the OLED.

A second initialization gate electrode G7 of the second initialization TFT T7 is connected to the second scanning line 24. A second initialization source electrode S7 of the second initialization TFT T7 is connected to the anode electrode of the OLED. A second initialization drain electrode D7 of the second initialization TFT T7 is connected to the initialization voltage line 22. The second initialization TFT T7 is turned on according to the second scanning signal Sn−1 received through the second scanning line 24, thereby initializing the anode electrode of the OLED.

In the current embodiment, the first initialization TFT T4 and the second initialization TFT T7 are connected to the second scanning line 24, but alternatively, the first initialization TFT T4 can be connected to the second scanning line 24 to be driven according to the second scanning signal Sn−1, and the second initialization TFT T7 can be connected to a separate third scanning line to be driven according to a third scanning signal Sn+1.

A second electrode 52 of the storage capacitor Cst is connected to the driving voltage line 26. The first electrode 51 is connected to the driving gate electrode G1, the compensation drain electrode D3, and the first initialization source electrode S4.

A cathode electrode of the OLED is connected to the second power voltage ELVSS. The OLED receives the driving current Id from the driving TFT T1 to emit light, thereby displaying an image.

Figure 3:
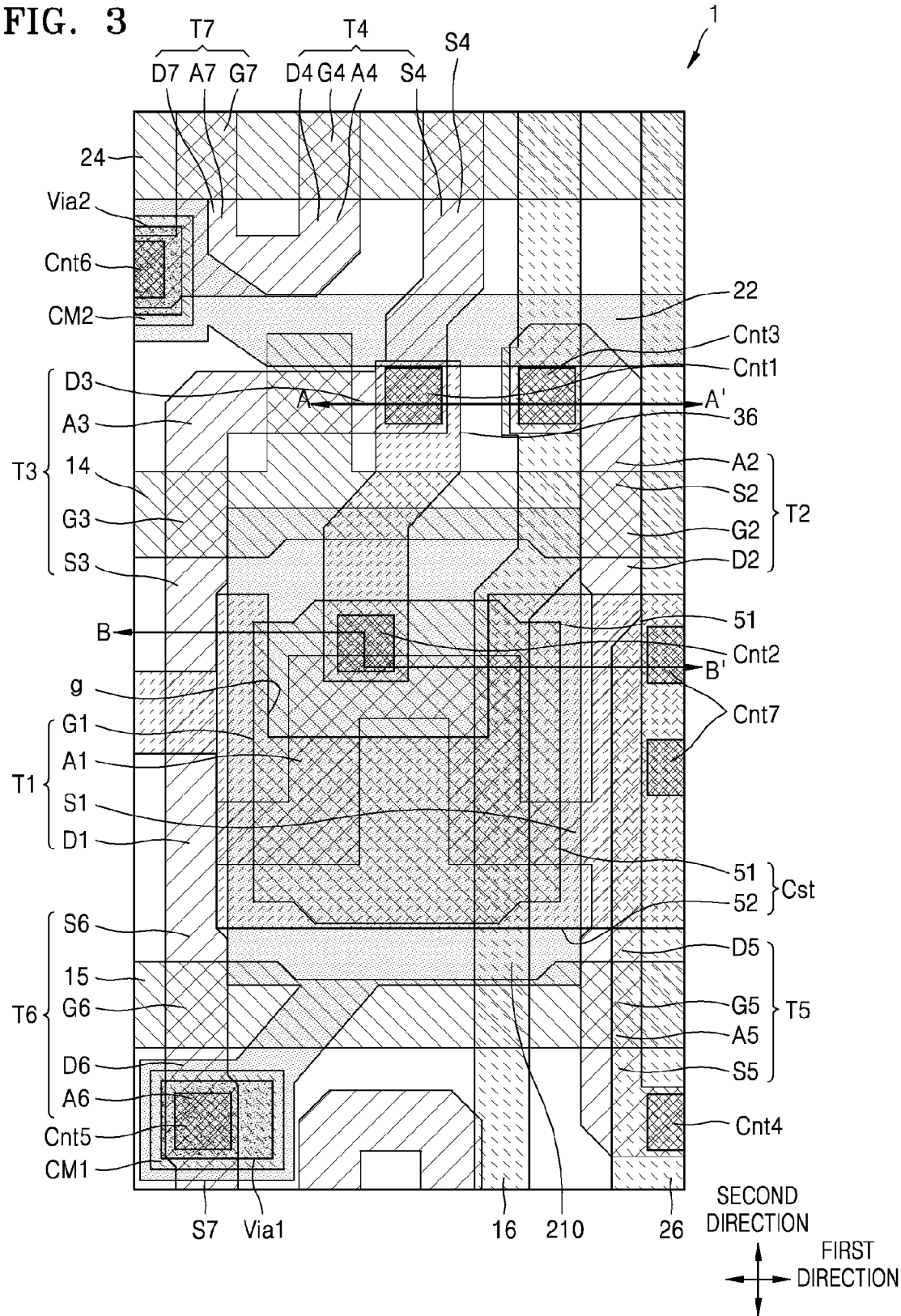
FIG. 3 is a plan view schematically illustrating one pixel included in an OLED display, according to an exemplary embodiment.

FIG. 3 is a plan view schematically illustrating the pixel 1 included in an OLED display, according to an exemplary embodiment.

Referring to FIG. 3, the pixel 1 includes a plurality of wires, the driving TFT T1, the switching TFTs, the capacitor Cst, and a pixel electrode 210.

The wires can include the first and second scanning lines 14 and 24 and the initialization voltage line 22, which extend in a first direction. The wires can also include data line 16 and the driving voltage line 26 both extending in a second direction to cross the first and second scanning lines 14 and 24. The first and second scanning lines 14 and 24 can be formed on the same layer as gate electrodes of the TFTs, and the initialization voltage line 22 can be formed on the same layer as the pixel electrode 210.

The driving TFT T1 includes a driving semiconductor layer A1, the driving gate electrode G1, the driving source electrode S1, and the driving drain electrode D1. The driving source electrode S1 corresponds to an impurity-doped driving source region in the driving semiconductor layer A1, and the driving drain electrode D1 corresponds to an impurity-doped driving drain region in the driving semiconductor layer A1. In the driving semiconductor layer A1, a region between the impurity-doped driving source region and the driving drain electrode D1 corresponds to a driving channel region. The driving gate electrode G1 is connected to the storage capacitor Cst, the compensation drain electrode D3, and the first initialization source electrode S4. For example, the driving gate electrode G1 also controls operations of the first electrode 51.

The data transmission TFT T2 includes a data transmission semiconductor layer A2, the data transmission gate electrode G2, the data transmission source electrode S2, and the data transmission drain electrode D2. The data transmission source electrode S2 corresponds to an impurity-doped switching source region in the data transmission semiconductor layer A2, and the data transmission drain electrode D2 corresponds to an impurity-doped switching drain region in the data transmission semiconductor layer A2. The data transmission source electrode S2 is connected to the data line 16 through a third contact hole Cnt3. The data transmission drain electrode D2 is connected to the driving TFT T1 and the first emission control TFT T5. The data transmission gate electrode G2 is formed as a part of the first scanning line 14.

The compensation TFT T3 includes a compensation semiconductor layer A3, the compensation gate electrode G3, the compensation source electrode S3, and the compensation drain electrode D3. The compensation source electrode S3 corresponds to an impurity-doped compensation source region in the compensation semiconductor layer A3, and the compensation drain electrode D3 corresponds to an impurity-doped compensation drain region in the compensation semiconductor layer A3. The compensation gate electrode G3 prevents a leakage current by forming a dual-gate electrode by using a part of the first scanning line 14 and a part of wire protruding and extending from the first scanning line 14.

The first initialization TFT T4 includes a first initialization semiconductor layer A4, the first initialization gate electrode G4, the first initialization source electrode S4, and the first initialization drain electrode D4. The first initialization source electrode S4 corresponds to an impurity-doped first initialization source region in the first initialization semiconductor layer A4, and the first initialization drain electrode D4 corresponds to an impurity-doped first initialization drain region in the first initialization semiconductor layer A4. The first initialization drain electrode D4 can be connected to the second initialization TFT T7, and the first initialization source electrode S4 can be connected to the driving gate electrode G1 through a connecting wire 36. The first initialization gate electrode G4 is formed as a part of the second scanning line 24.

The connecting wire 36 can extend in the second direction and can be formed adjacent to the data line 16. The connecting wire 36 can electrically connect the first initialization TFT T4 to the driving TFT T1 through first and second contact holes Cnt1 and Cnt2.

The first emission control TFT T5 includes a first emission control semiconductor layer A5, the first emission control gate electrode G5, the first emission control source electrode S5, and the second emission control drain electrode D5. The first emission control source electrode S5 corresponds to an impurity-doped first emission control source region in the first emission control semiconductor layer A5. The second emission control drain electrode D5 corresponds to an impurity-doped first emission control drain region in the first emission control semiconductor layer A5. The first emission control source electrode S5 can be connected to the driving voltage line 26 through a fourth contact hole Cnt4. The first emission control gate electrode G5 is formed as a part of the emission control line 15.

The second emission control TFT T6 includes a second emission control semiconductor layer A6, the second emission control gate electrode G6, the second emission control source electrode S6, and the second emission control drain electrode D6. The second emission control source electrode S6 corresponds to an impurity-doped second emission control source region in the second emission control semiconductor layer A6, and the second emission control drain electrode D6 corresponds to an impurity-doped second emission control drain region in the second emission control semiconductor layer A6. The second emission control drain electrode D6 is connected to a first cover metal CM1 through a fifth contact hole Cnt5, and the first cover metal CM1 is connected to the pixel electrode 210 of the OLED through a first via hole via1. The second emission control gate electrode G6 is formed as a part of the emission control line 15.

The second initialization TFT T7 includes a second initialization semiconductor layer A7, the second initialization gate electrode G7, the second initialization source electrode S7, and the second initialization drain electrode D7. The second initialization source electrode S7 corresponds to an impurity-doped second initialization source region in the second initialization semiconductor layer A7, and the second initialization drain electrode D7 corresponds to an impurity-doped second initialization drain region in the second initialization semiconductor layer A7. The second initialization drain electrode D7 is connected to a second cover metal CM2 through a sixth contact hole Cnt6. The second cover metal CM2 can be connected to the initialization voltage line 22 through a second via hole via2. The second initialization source electrode S7 is connected to the pixel electrode 210 of the OLED via the first cover metal CM1.

The first electrode 51 of the storage capacitor Cst is directly connected to the driving gate electrode G1, and is formed to at least partially overlap the driving semiconductor layer A1. The first electrode 51 is connected to the first initialization TFT T4 through the connecting wire 36 contacting through the second contact hole Cnt2. The driving gate electrode G1 can also control operations of the first electrode 51 of the storage capacitor Cst. The second contact hole Cnt2 is formed on the driving gate electrode G1 to expose a part of the driving gate electrode G1 (or the first electrode 51 of the storage capacitor Cst).

The second electrode 52 of the storage capacitor Cst is formed to at least partially overlap the first electrode 51. The second electrode 52 and the connecting wire 36 are formed on the same layer. One end of the connecting wire 36 is connected to the first initialization TFT T4 through the first contact hole Cnt1 as described above, and another end of the connecting wire 36 is electrically connected to the first electrode 51 (or the driving gate electrode G1) through the second contact hole Cnt2. Accordingly, the other end of the connecting wire 36 partially overlaps the first electrode 51, and the second electrode 62 includes a concave portion g formed at a location corresponding to a region where the other end of the connecting wire 36 and the first electrode 51 overlap each other.

The pixel electrode 210 is formed to overlap at least a part of the driving TFT T1, the storage capacitor Cst, and the connecting wire 36, and is connected to the second emission control TFT T6 through the first via hole via1.

Figure 4:
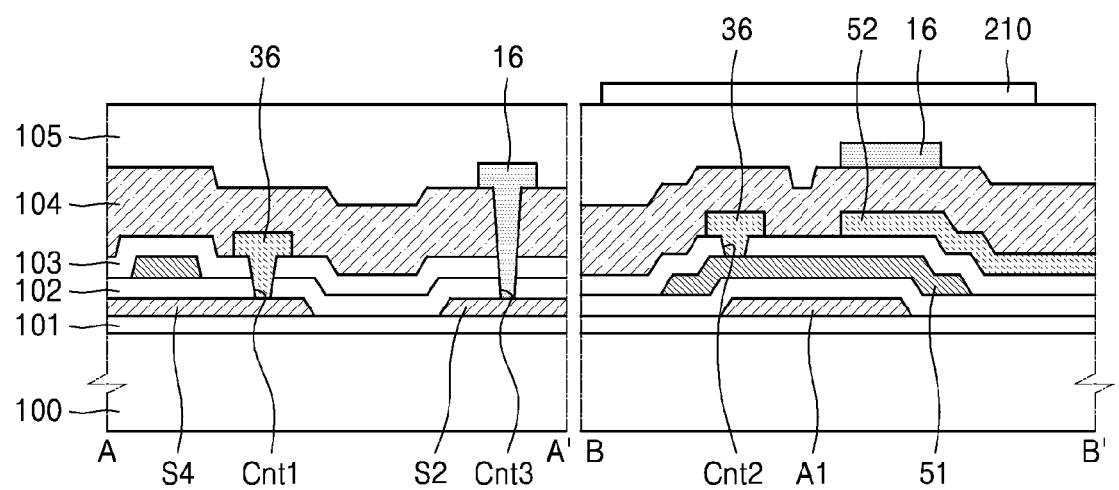
FIG. 4 shows cross-sectional views of the pixel of FIG. 3 taken along lines A-A' and B-B'.

FIG. 4 shows cross-sectional views of the pixel of FIG. 3 taken along lines A-A' and B-B' of FIG. 3.

Referring to FIG. 4, a buffer layer 101 is formed on a substrate 100, and semiconductor layers are formed on the buffer layer 101. The first initialization source electrode S4 and the data transmission source electrode S2, which are partial regions of an impurity-doped semiconductor layer, are shown in the cross-sectional view taken along the line A-A', and the driving semiconductor layer A1 is shown in the cross-sectional view taken along the line B-B'.

A first gate insulating layer 102, a first conductive layer including the first electrode 51, a second gate insulating layer 103, a second conductive layer including the connecting wire 36 and the second electrode 52 of the storage capacitor Cst, an interlayer insulating layer 104, a third conductive layer including the data line 16 and the driving voltage line 26 of FIG. 3, and a planarization film 105 are sequentially formed on the semiconductor layers. The first gate insulating layer 102, the second gate insulating layer 103, the interlayer insulating layer 104, and the planarization film 105 all have insulating properties, and include an inorganic material and/or an organic material.

The connecting wire 36 and the data line 16 are formed adjacent to each other, but on different layers. As described above with reference to FIG. 3, the connecting wire 36, the data line 16, and the driving voltage line 26 all extend in the second direction. The data line 16 and the connecting wire 36 are formed adjacent to each other.

If the connecting wire 36 and the data line 16 are formed on the same layer, parasitic capacitance is formed in a horizontal direction, and crosstalk can be generated. However, according to an exemplary embodiment, since the connecting wire 36 and the data line 16 are formed adjacent to each other but on the different layers, parasitic capacitance is prevented or reduced, thereby preventing or reducing crosstalk.

Since the connecting wire 36 is not formed on the same layer as the data line 16 but below the data line 16, a plurality of insulating layers, such as the interlayer insulating layer 104 and the planarization film 105, can be formed between the connecting wire 36 and the pixel electrode 210. If the connecting wire 36 is formed on the same layer as the data line 16, a distance between the connecting wire 36 and the pixel electrode 210 is relatively short, and thus potential deviation is generated in the driving gate electrode G1 by parasitic capacitance between the connecting wire 36 and the pixel electrode 210, thereby generating a spot or color variation.

However, according to an exemplary embodiment, since the connecting wire 36 is formed on a different layer from the data line 16, for example, below the data line 16, parasitic capacitance is prevented or reduced, thereby preventing or reducing a spot or color variation.

FIGS. 5 through 12 are views for describing a method of forming one pixel 1 of an OLED display, according to an exemplary embodiment.

Figure 5:
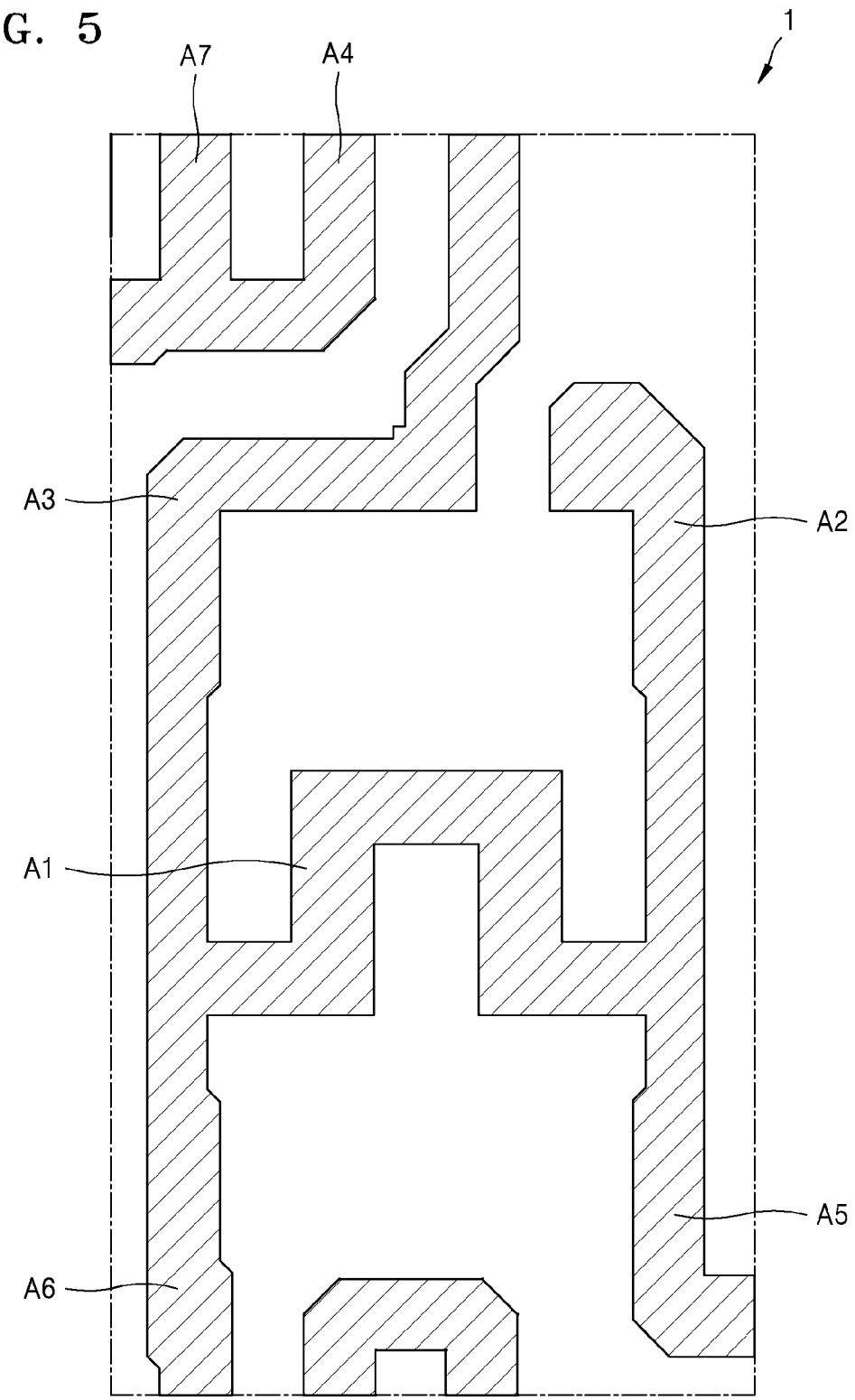
FIGS. 5 through 12 are views for describing a method of forming one pixel of an OLED display, according to an exemplary embodiment.

Referring to FIGS. 4 and 5, the semiconductor layers, i.e., the driving semiconductor layer A1, the data transmission semiconductor layer A2, the compensation semiconductor layer A3, the first initialization semiconductor layer A4, the first emission control semiconductor layer A5, the second emission control semiconductor layer A6, and the second initialization semiconductor layer A7, are formed on the substrate 100 where the buffer layer 101 is formed. The semiconductor layers can be an amorphous silicon layer, a polycrystalline silicon layer, or an oxide semiconductor layer, such as $(In_2O_3)_a(Ga_2O_3)_b(ZnO)_c$ layer (G-I—Z—O layer), wherein a, b, and c are real numbers satisfying $a \geq 0$, $b \geq 0$, and $c \geq 0$.

The driving semiconductor layer A1 having the driving channel region is curved or bent such that the driving channel region is elongated in a narrow space. Since the driving channel region of the driving TFT T1 can be elongated, a driving range of a gate voltage applied to the driving gate electrode G1 can be increased. Thus, by changing a level of a driving gate voltage, grayscale of light emitted from the OLED can be substantially precisely controlled. Accordingly, resolution and display quality of the OLED display can be improved. The driving channel region of the driving TFT T1 can be curved or bent in a variety of shapes.

The first gate insulating layer 102 is formed on the semiconductor layers. The first gate insulating layer 102 at least partially covers the semiconductor layers and is formed on substantially the entirety of the surface of the substrate 100. The first gate insulating layer 102 can be formed of an organic and/or inorganic insulating material. According to an exemplary embodiment, the first gate insulating layer 102 is formed of silicon nitride (SiNx), silicon oxide (SiO2), hafnium oxide (HfO), or aluminum oxide (AlO).

Figure 6:
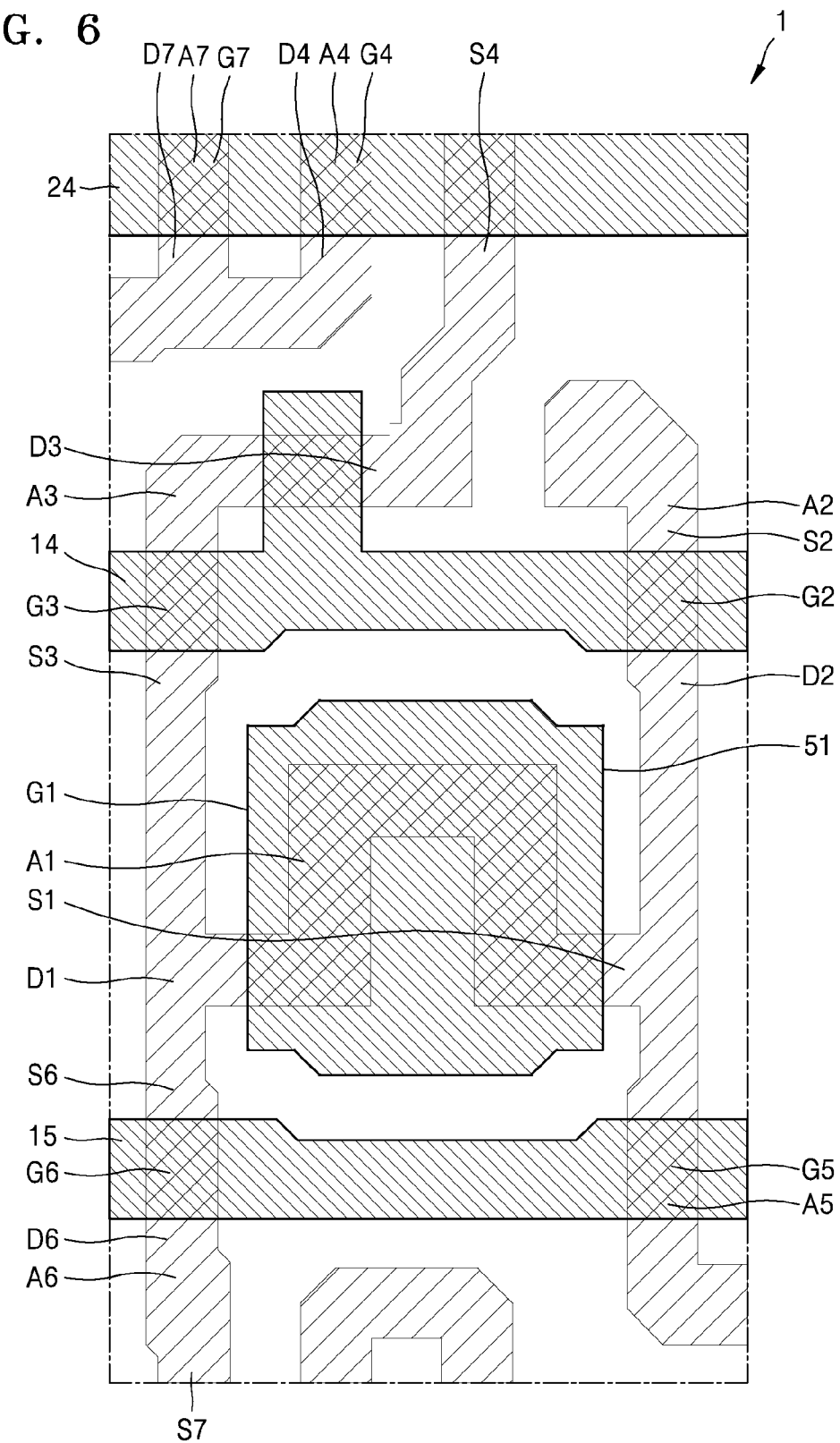

Referring to FIGS. 4 and 6, the first conductive layer including gate electrodes (i.e., the driving gate electrode G1, the data transmission gate electrode G2, the compensation gate electrode G3, the first initialization gate electrode G4, the first emission control gate electrode G5, the second emission control gate electrode G6, and the second initialization gate electrode G7), the first and second scanning lines 14 and 24, and the emission control line 15 are formed on the first gate insulating layer 102. The gate electrodes, the first and second scanning lines 14 and 24, and the emission control lines 15 are formed on the same layer and of the same material as each other.

The first scanning line 14 operates as the compensation gate electrode G3 and the data transmission gate electrode G2 respectively of the compensation TFT T3 and the data transmission TFT T2. The second scanning line 24 operates as the first initialization gate electrode G4 and the second initialization gate electrode G7 respectively of the first initialization TFT T4 and the second initialization TFT T7. The emission control line 15 operates as the first emission control gate electrode G5 and the second emission control gate electrode G6 respectively of the first emission control TFT T5 and the second emission control TFT T6.

The driving gate electrode G1 also operates as the first electrode 51 of the storage capacitor Cst. The driving gate electrode G1 is a floating electrode, and at least partially overlaps a channel region of the driving semiconductor layer A1 of the driving TFT T1.

Then, by injecting impurities at two ends of the semiconductor layers by using the gate electrodes as masks, the source electrodes (i.e., the driving source electrode S1, the data transmission source electrode S2, the compensation source electrode S3, the first initialization source electrode S4, the first emission source electrode S5, the second emission control source electrode S6, and the second initialization source electrode S7), and the drain electrodes (i.e., the driving drain electrode D1, the data transmission drain electrode D2, the compensation drain electrode D3, the first initialization drain electrode D4, the first emission drain electrode D5, the second emission control drain electrode D6, and the second initialization drain electrode D7) can be formed. The impurities can differ according to a type of a TFT, and can be an N-type or a P-type.

The second gate insulating layer 103 is formed on the gate electrodes throughout the substrate 100. The second gate insulating layer 103 can be formed of an organic and/or inorganic insulating material. According to an exemplary embodiment, the second gate insulating layer 103 is formed of SiNx, SiO2, HfO, or AlO.

Figure 7:
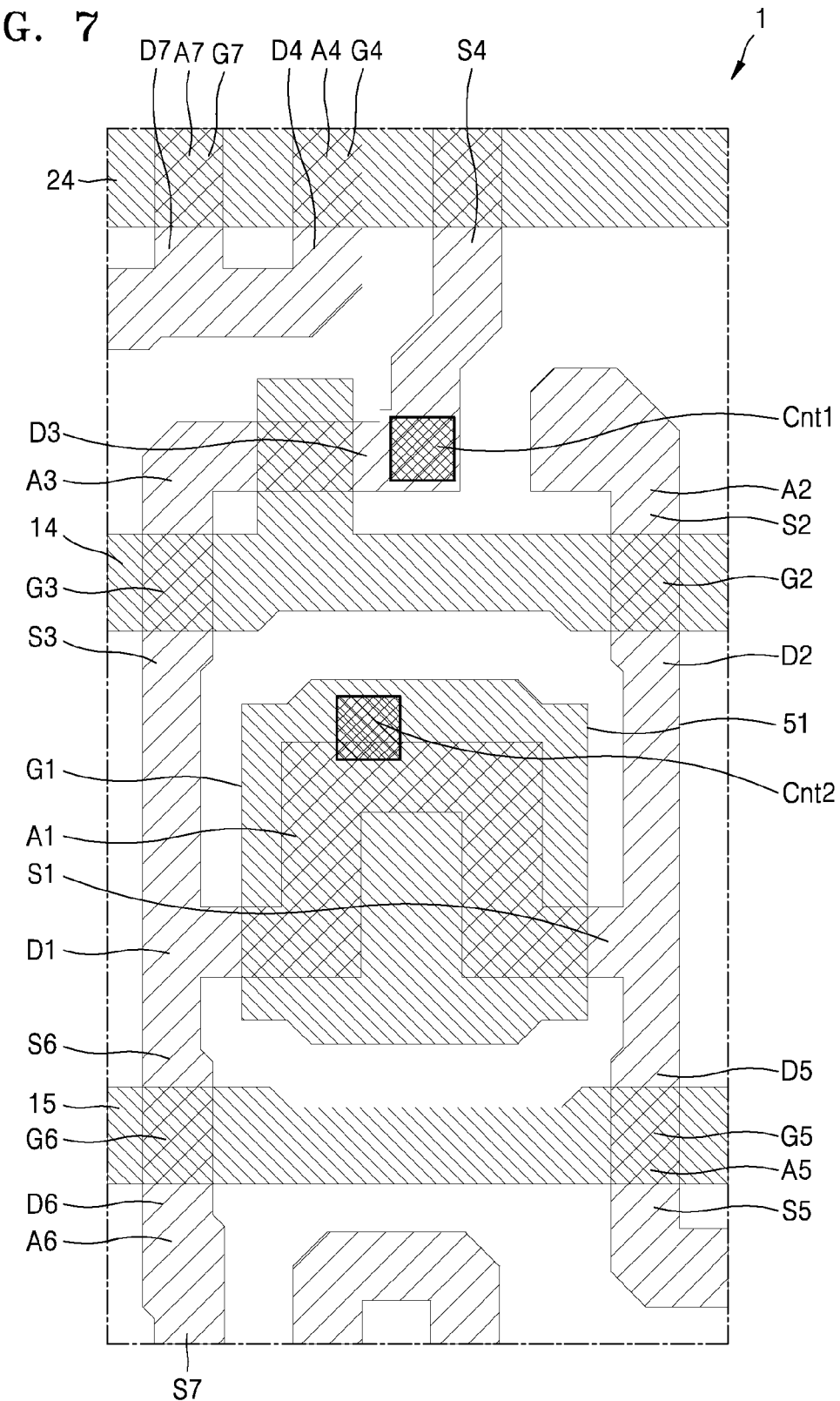

Referring to FIGS. 4 and 7, the first and second contact holes Cnt1 and Cnt2 penetrating through the second gate insulating layer 103 are formed. The first contact hole Cnt1 can expose the first initialization source electrode S4, and the second contact hole Cnt2 can expose the driving gate electrode G1.

Figure 8:
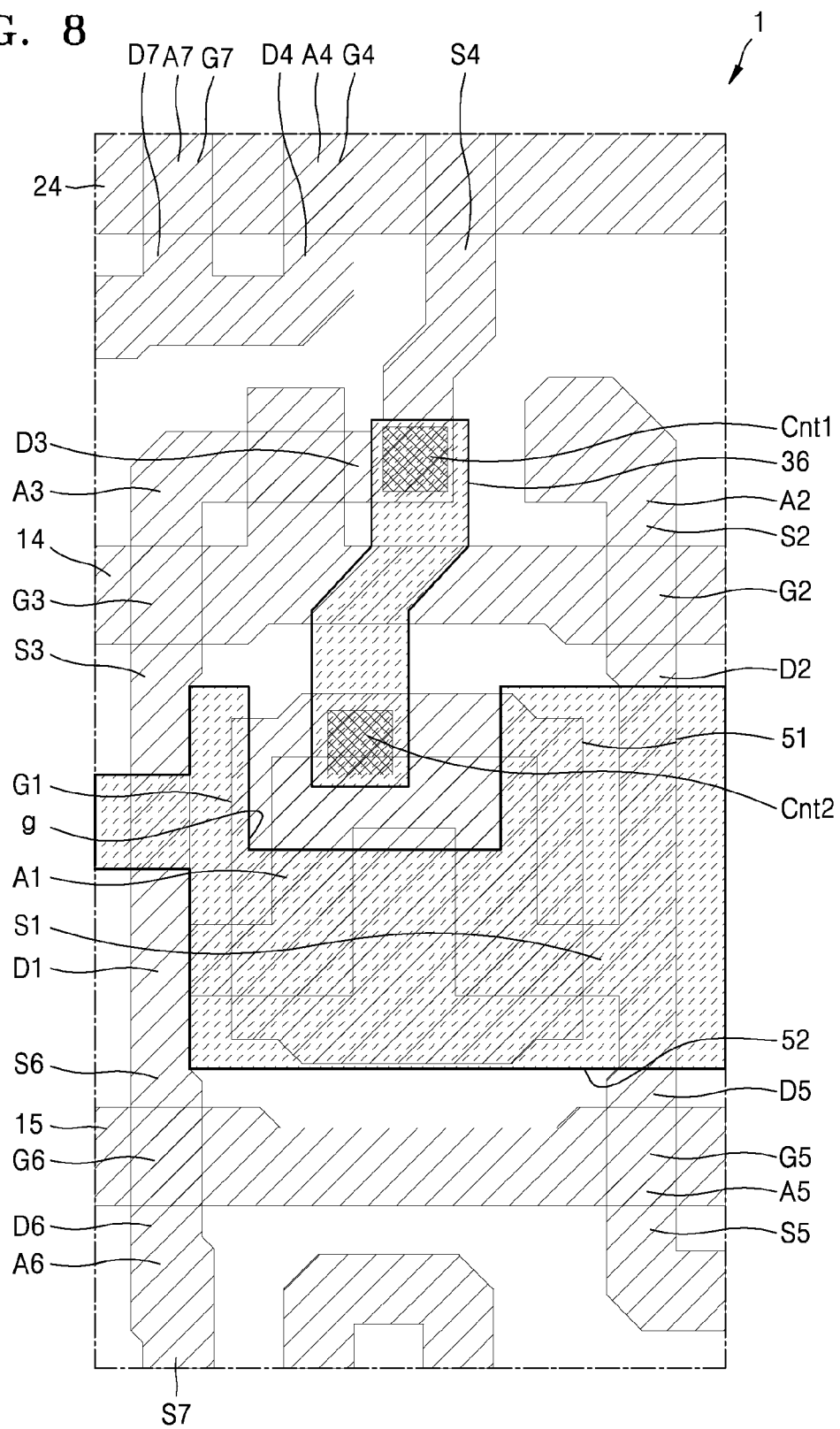

Referring to FIGS. 4 and 8, the second conductive layer including the connecting wire 36 and the second electrode 52 of the storage capacitor Cst is formed. The connecting wire 36 and the second electrode 52 are formed on the same layer and of the same material.

The one end of the connecting wire 36 contacts the first initialization source electrode S4 of the first initialization TFT T4 through the first contact hole Cnt1, and the other end of the connecting wire 36 contacts the driving gate electrode G1 (or the first electrode 51 of the storage capacitor Cst) through the second contact hole Cnt2.

The second electrode 52 overlaps the first electrode 51. The capacity of the storage capacitor Cst is determined by the second gate insulating layer 103 formed between the first electrode 51 and the second electrode 52.

Since the other end of the connecting wire 36 at least partially overlaps the first electrode 51, the second electrode 52 includes the concave portion g at the location corresponding to the region where the other end of the connecting wire 36 and the first electrode 51 overlap each other.

Then, the interlayer insulating layer 104 is formed to cover the connecting wire 36 and the second electrode 52. The interlayer insulating layer 104 can be formed of an organic and/or inorganic insulating material.

Figure 9:
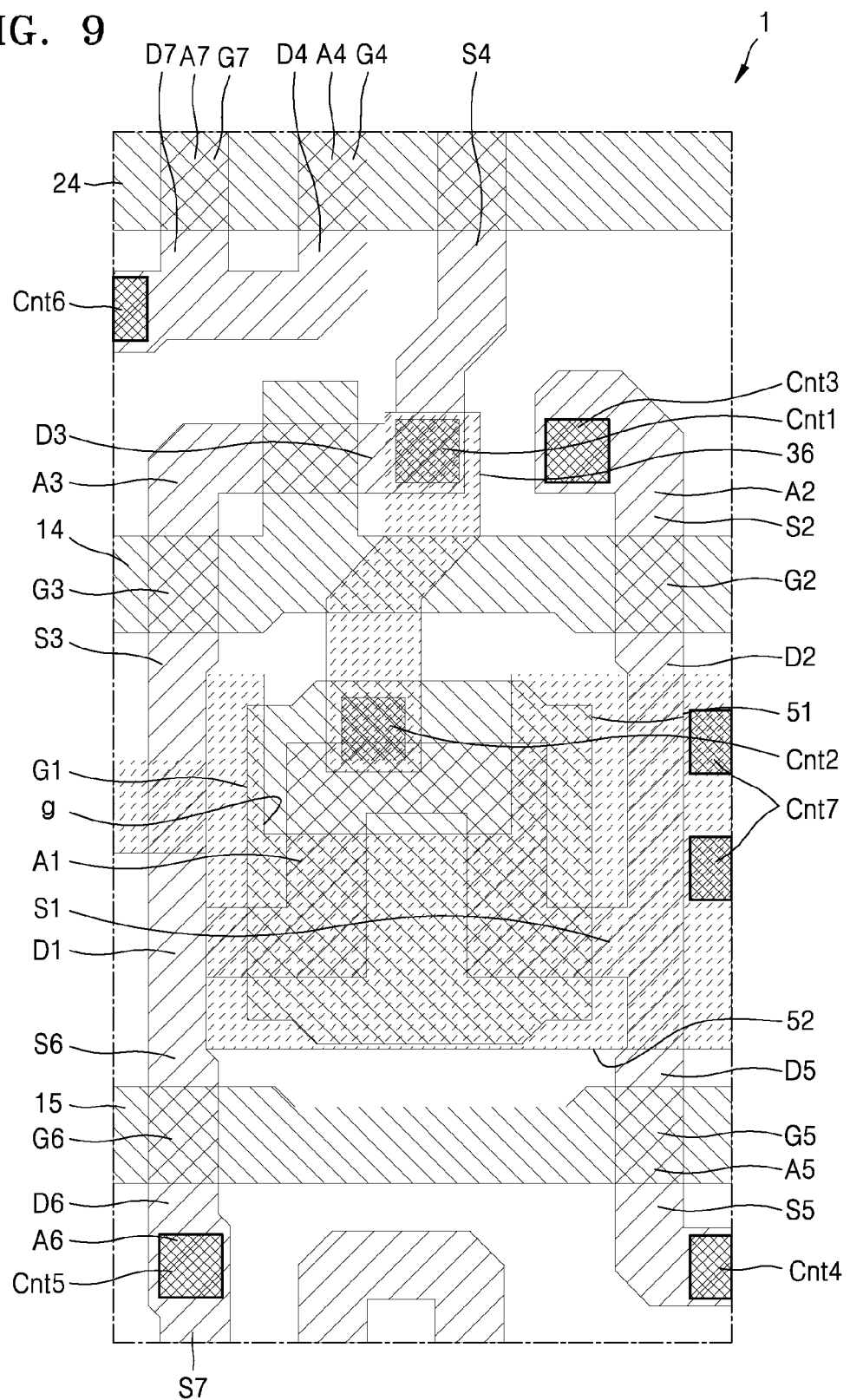

Referring to FIGS. 4 and 9, the third through seventh contact holes Cnt3 through Cnt7 that penetrate through the interlayer insulating layer 104 are formed. The third contact hole Cnt3 exposes the data transmission source electrode S2, the fourth contact hole Cnt4 exposes the first emission control source electrode S5, the fifth contact hole Cnt5 exposes the second emission control drain electrode D6, and the sixth contact hole Cnt6 exposes the second initialization drain electrode D7. The seventh contact hole Cnt7 exposes the second electrode 52 of the storage capacitor Cst.

Figure 10:
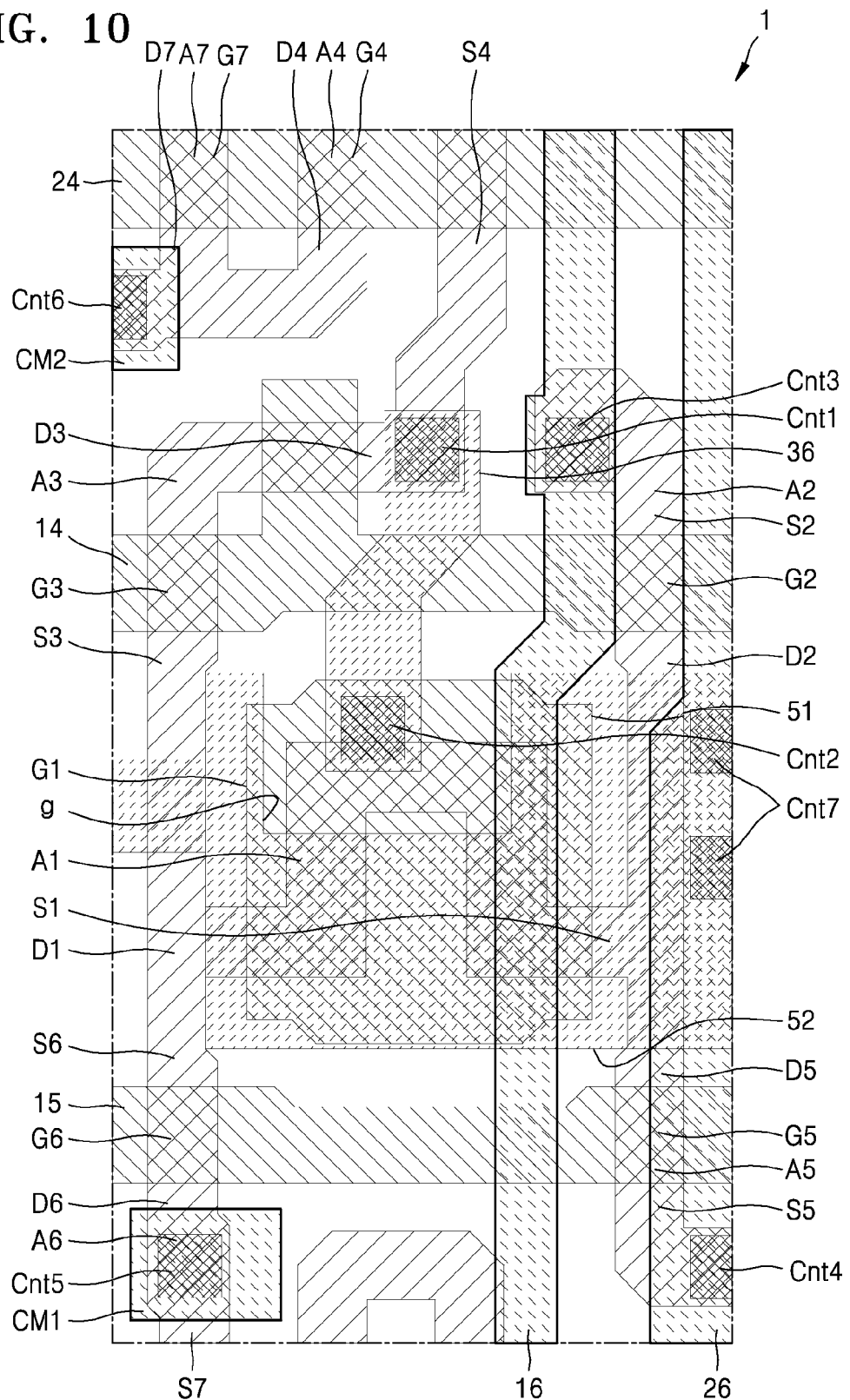

Referring to FIGS. 4 and 10, the third conductive layer including the data line 16, the driving voltage line 26, and the first and second cover metals CM1 and CM2 is formed. The data line 16, the driving voltage line 26, and the first and second cover metals CM1 and CM2 are formed on the same layer and of the same material.

The data line 16, the driving voltage line 26, and the first and second scanning lines 14 and 24 extend in the second direction to cross the first and second scanning lines 14 and 24, and the data line 16 is formed adjacent to the connecting wire 36. The data line 16 is formed per pixel 1. The driving voltage line 26 is connected to the second electrode 52 of the storage capacitor Cst through the seventh contact hole Cnt7 to form a mesh structure, and maintains electric potential of the second electrode 52 of the storage capacitor at a uniform level. The driving voltage line 26 can be shared with a neighboring pixel. For example, one driving voltage line 26 transmits a driving voltage to adjacent pixels.

The data line 16 is connected to the data transmission source electrode S2 through the third contact hole Cnt3, and the driving voltage line 26 is connected to the first emission control source electrode S5 through the fourth contact hole Cnt4. The first cover metal CM1 is connected to the second emission control drain electrode D6 through the fifth contact hole Cnt5. The second cover metal CM2 is connected to the second initialization drain electrode D7 through the sixth contact hole Cnt6.

Then, the planarization film 105 covering the data line 16, the driving voltage line 26, and the first and second cover metals CM1 and CM2 are formed. The planarization film 105 can be a single layer film or a multilayer film formed of an inorganic material, an organic material, or an organic/inorganic complex.

Figure 11:
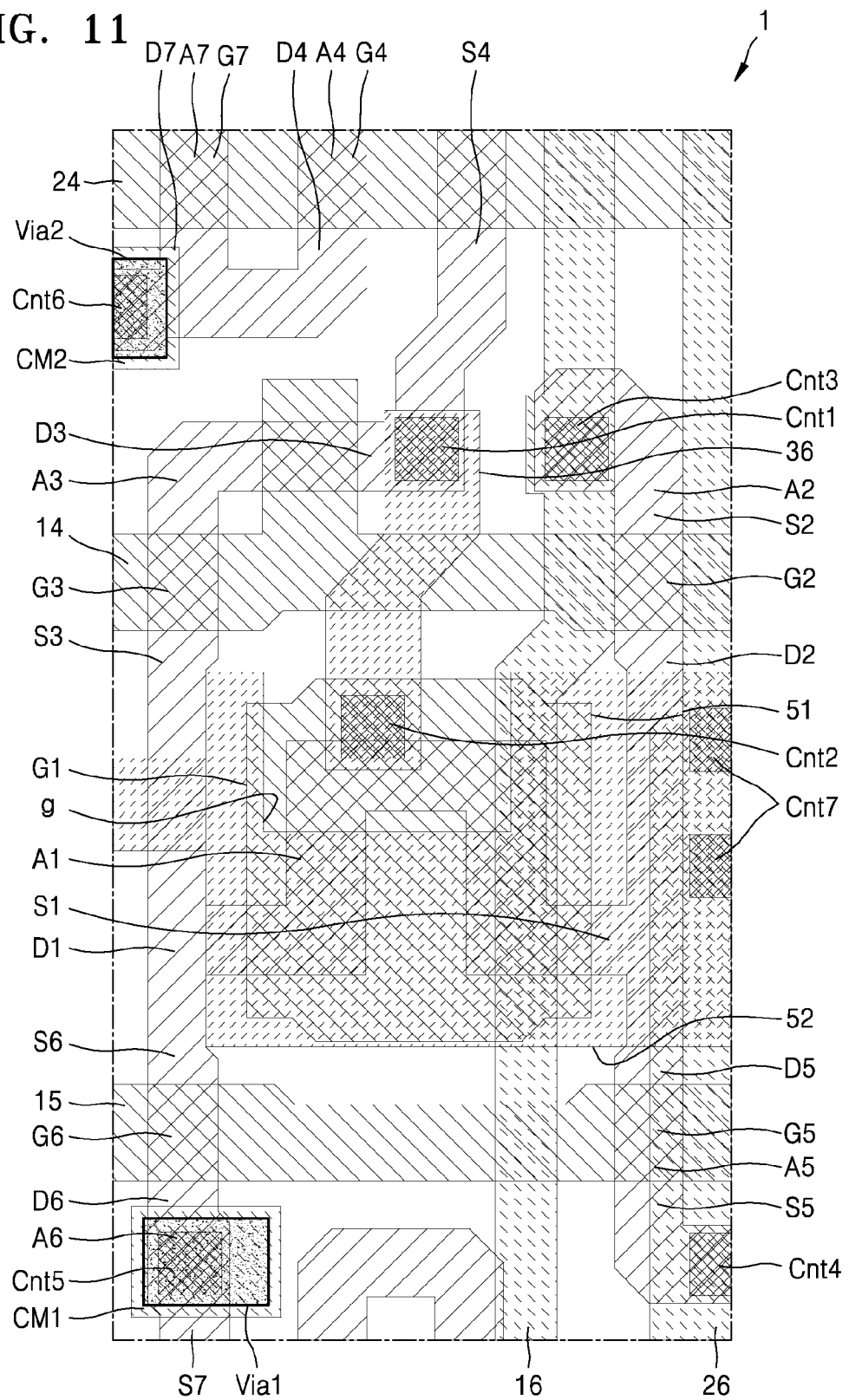

Referring to FIGS. 4 and 11, the first and second via holes via1 and via2 penetrating through the planarization film 105 are formed. The first via hole via1 is formed at a location corresponding to the fifth contact hole Cnt5 to expose the first cover metal CM1. The second via hole via2 is formed at a location corresponding to the sixth contact hole Cnt6 to expose the second cover metal CM2.

Figure 12:
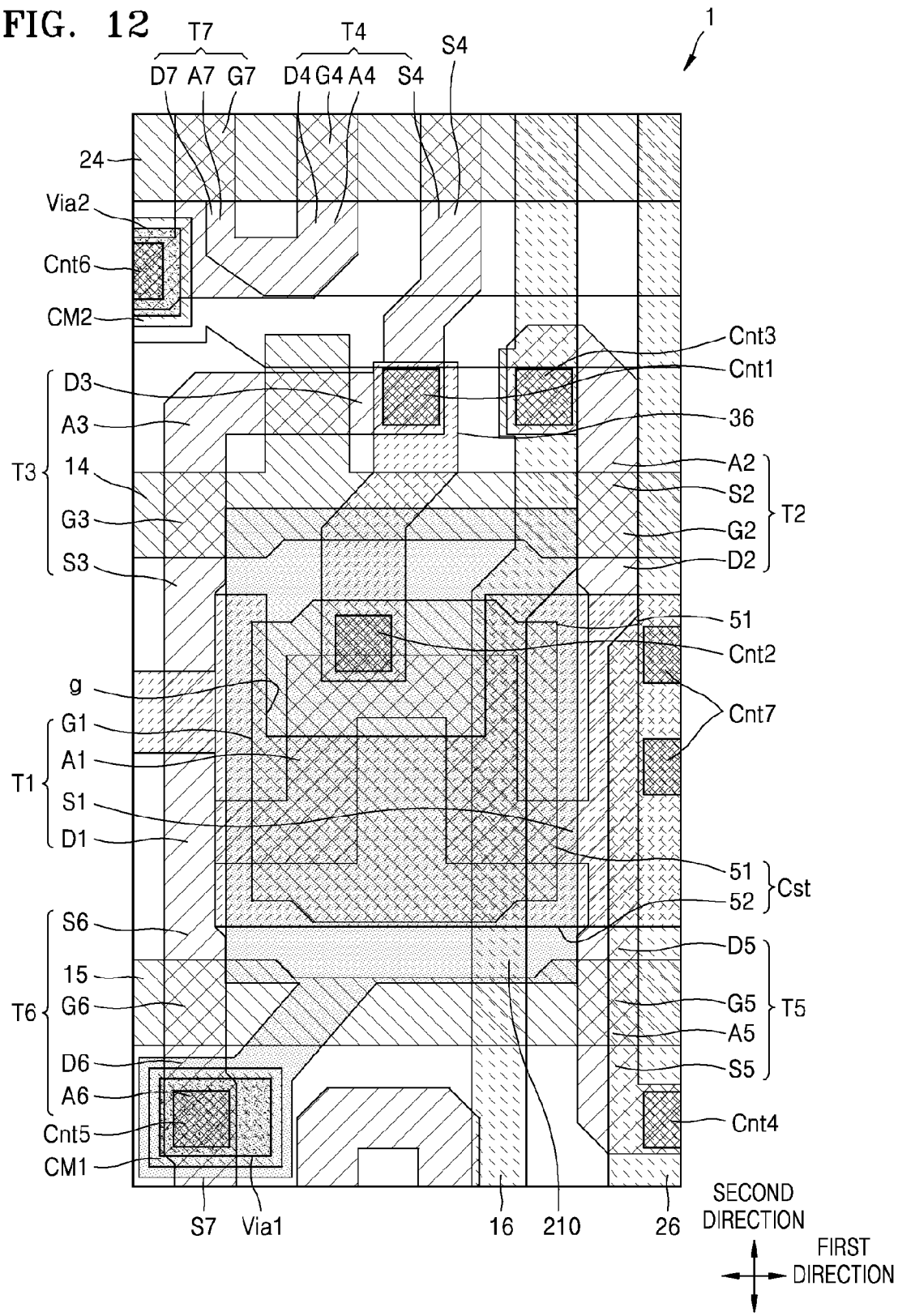

Referring to FIGS. 4 and 12, the pixel electrode 210 and the initialization voltage line 22 are formed. The pixel electrode 210 and the initialization voltage line 22 are formed on the same layer and of the same material.

The pixel electrode 210 contacts the first cover metal CM1 through the first via hole via1, and is connected to the second emission control TFT T6 by using the first cover metal CM1 as a medium. The pixel electrode 210 is formed to overlap at least parts of the driving TFT T1, the storage capacitor Cst, and the connecting wire 36.

The initialization voltage line 22 is connected to the second initialization TFT T7 through the second via hole via2.

Although not illustrated, a pixel-defining film having an opening that exposes a top portion of the pixel electrode 210 is formed on the planarization film 105, and an organic film including an emission layer is formed on the pixel electrode 210 that is exposed through the opening of the pixel-defining film. Also, a counter electrode covering the organic film and an entire surface of the substrate 100 is formed.

As described above, in the OLED display according to one or more embodiments of the present invention, the connecting wire 36 is formed on a different layer from the data line 16, for example, below the data line 16. Accordingly, parasitic capacitance between the connecting wire 36 and the data line 16 can be reduced, and parasitic capacitance between the connecting wire 36 and the pixel electrode 210 can be reduced. Consequently, crosstalk, spots, or color variation can be prevented or reduced, and thus a high quality image can be provided.

In the OLED display according to one or more embodiments, the storage capacitor Cst overlaps the driving TFT T1, and thus sufficient capacity can be obtained while high resolution is realized.

As described above, according to one or more exemplary embodiments, an OLED display can have low parasitic capacitance, thereby providing a high quality image.

While the inventive technology has been described with reference to the figures, it will be understood by those of ordinary skill in the art that various changes in form and details can be made therein without departing from the spirit and scope as defined by the following claims.

What is claimed is:

1. A method of manufacturing a display device comprising a plurality of switching thin film transistors (TFTs), a driving TFT and a plurality of pixels, the method comprising:
    forming a connecting wire configured to electrically connect a selected one of the switching TFTs to the driving TFT;
    forming a first wire extending in a first direction;
    forming a second wire extending in a second direction crossing the first direction, wherein the second wire is formed adjacent to the connecting wire and configured to transmit a signal to each of the pixels,
    forming an insulating layer, wherein one of the connecting wire and the second wire is disposed over the insulating layer and the other is disposed below the insulating layer.

2. The method of claim 1, wherein connecting wire is disposed below the second wire with the insulating layer therebetween.

3. The method of claim 1, wherein the second wire comprises a data line.

4. The method of claim 1, further comprising forming a storage capacitor including a first electrode and a second electrode, wherein the connecting wire and the second electrode include the same material.

5. The method of claim 4, wherein the second electrode of the storage capacitor has a concave portion formed where one lateral end of the connecting wire and the first electrode of the storage capacitor overlap each other.

6. The method of claim 1, further comprising forming a pixel electrode formed over the second wire and at least partially overlapping the connecting wire.

7. The method of claim 6, further comprising:
forming an additional insulating layer over the insulating layer and below the pixel electrode.

8. A display device comprising a plurality of pixels, wherein each of the pixels comprises:
a plurality of wires comprising a first wire extending in a first direction and a second wire extending in a second direction crossing the first direction;
a plurality of switching thin-film transistors (TFTs) electrically connected to the wires;
a driving TFT configured to supply a driving current;
a storage capacitor electrically connected to the wires and the driving TFT;
a connecting wire electrically connecting the driving TFT to a selected one of the switching TFTs; and
an insulating layer between the second wire and the connecting wire, wherein one of the second wire and the connecting wire is disposed over the insulating layer and the other is disposed below the insulating layer.

9. The display device of claim 8, wherein the first wire comprises a scanning line configured to provide a scanning signal, and wherein the second wire comprises a data line configured to provide a data signal.

10. The display device of claim 8, wherein the driving TFT includes a gate electrode, and wherein the selected switching TFT includes an initialization TFT configured to supply an initialization voltage to the gate electrode.

11. The display device of claim 8, wherein the connecting wire is disposed below the second wire with the insulating layer therebetween.

12. The display device of claim 11, wherein the driving TFT comprises a driving gate electrode, and wherein the connecting wire is formed over the driving gate electrode.

13. The display device of claim 8, wherein each of the pixels further comprises a pixel electrode formed over the connecting wire and at least partially overlapping the connecting wire.

14. The display device of claim 13, further comprising:
an additional insulating layer formed between the insulating layer and the pixel electrode.

15. The display device of claim 8, wherein the storage capacitor comprises first and second electrodes, and wherein the connecting wire and the second electrode include the same material.

16. The display device of claim 15, wherein the driving TFT comprises a driving gate electrode,
wherein the first electrode of the storage capacitor is electrically connected to the driving gate electrode, and
wherein the connecting wire has i) one lateral end electrically connected to the one of the switching TFTs via a first contact hole and ii) another lateral end electrically connected to the first electrode of the storage capacitor through a second contact hole.

17. The display device of claim 16, wherein the second electrode of the storage capacitor at least partially overlaps the first electrode of the storage capacitor and has a concave portion formed where the another lateral end of the connecting wire and the first electrode of the storage capacitor overlap each other.

18. A display device, comprising:
a scan driver configured to provide a scan signal through a scan line extending in a first direction;
a data driver configured to provide a data signal through a data line extending in a second direction crossing the first direction; and
a pixel electrically connected to the scan line and the data line, wherein each pixel comprises:
a switching thin-film transistor (TFT) configured to receive the scan signal and the data signal so as to generate a driving signal;
a driving TFT configured to receive the driving signal so as to generate a driving current;
a connecting wire electrically connecting the driving TFT to the switching TFT, and
an insulating layer between the data line and the connecting wire, wherein one of the data line and the connecting wire is disposed over the insulating layer and the other is disposed below the insulating layer.

19. The display device of claim 18, wherein the height of the data line is greater than that of the connecting wire.

* * * * *